(12) United States Patent
Hsieh et al.

(10) Patent No.: US 10,622,245 B2
(45) Date of Patent: Apr. 14, 2020

(54) FINFET WITH CURVED STI

(71) Applicant: UNITED MICROELECTRONICS CORP., Hsin-Chu (TW)

(72) Inventors: Chi-Ying Hsieh, Tainan (TW); Chih-Jung Chen, Hsinchu County (TW); Chien-Hung Chen, Hsinchu County (TW); Chih-Yueh Li, Taipei (TW); Cheng-Pu Chiu, New Taipei (TW); Shih-Min Lu, Tainan (TW); Yung-Sung Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/442,539

(22) Filed: Jun. 16, 2019

(65) Prior Publication Data

US 2019/0378752 A1 Dec. 12, 2019

Related U.S. Application Data

(63) Continuation of application No. 16/026,077, filed on Jul. 3, 2018, now Pat. No. 10,373,861.

(30) Foreign Application Priority Data

Jun. 7, 2018 (CN) .......................... 2018 1 0579878

(51) Int. Cl.
*H01L 21/762* (2006.01)
*H01L 29/78* (2006.01)
*H01L 29/06* (2006.01)
*H01L 29/66* (2006.01)
*H01L 29/08* (2006.01)

(52) U.S. Cl.
CPC .. *H01L 21/76232* (2013.01); *H01L 21/76229* (2013.01); *H01L 29/0653* (2013.01); *H01L 29/0847* (2013.01); *H01L 29/66545* (2013.01); *H01L 29/66636* (2013.01); *H01L 29/66795* (2013.01); *H01L 29/7848* (2013.01); *H01L 29/7851* (2013.01)

(58) Field of Classification Search
CPC ........... H01L 21/76232; H01L 29/0653; H01L 29/0847; H01L 29/66545; H01L 29/66636; H01L 29/66795; H01L 29/7848; H01L 29/7851
See application file for complete search history.

(56) References Cited

U.S. PATENT DOCUMENTS

| 10,038,093 | B2 | 7/2018 | Sung | |
|---|---|---|---|---|
| 10,109,531 | B1 * | 10/2018 | Hsu | .................... H01L 21/76224 |
| 2011/0193175 | A1 * | 8/2011 | Huang | ............ H01L 21/823431 257/386 |
| 2014/0035066 | A1 | 2/2014 | Tsai | |

(Continued)

*Primary Examiner* — Peter Bradford
(74) *Attorney, Agent, or Firm* — Winston Hsu

(57) ABSTRACT

A semiconductor structure includes a substrate having a plurality of fin structures thereon, an isolation oxide structure in the substrate between adjacent two of the plurality of fin structures, a gate disposed on the plurality of fin structures, a gate dielectric layer disposed between the plurality of fin structures and the gate, and a source/drain doped region in each of the plurality of fin structures. The isolation oxide structure has a concave, curved top surface.

7 Claims, 4 Drawing Sheets

(56) References Cited

U.S. PATENT DOCUMENTS

| | | | |
|---|---|---|---|
| 2015/0270401 A1* | 9/2015 | Huang | ................ H01L 29/7851 |
| | | | 257/192 |
| 2016/0315146 A1 | 10/2016 | Jung | |
| 2017/0062613 A1 | 3/2017 | Sung | |
| 2017/0069539 A1* | 3/2017 | Li | ................... H01L 21/823431 |
| 2017/0077095 A1 | 3/2017 | Lu | |
| 2017/0148636 A1* | 5/2017 | Liu | ................... H01J 37/32009 |
| 2018/0040694 A1 | 2/2018 | Tseng | |
| 2019/0067450 A1* | 2/2019 | Ching | ............. H01L 21/823821 |
| 2019/0067451 A1* | 2/2019 | Ching | ............... H01L 29/41791 |

* cited by examiner

FINFET WITH CURVED STI

CROSS REFERENCE TO RELATED APPLICATIONS

This application is a continuation of U.S. application Ser. No. 16/026,077 filed Jul. 3, 2018, which is included in its entirety herein by reference.

BACKGROUND OF THE INVENTION

1. Field of the Invention

The present invention relates to a semiconductor structure and a method of manufacturing the same, and more particularly to a fin-type field effect transistor (FinFET) device structure.

2. Description of the Prior Art

The higher integration of semiconductor memory devices helps to meet consumer demand for superior performance and low price. However, as the density of circuit elements in a chip or die increases and the distance between adjacent circuit elements becomes smaller and smaller, the semiconductor process also encounters more and more challenges.

In the process of fabricating a nano-scale fin-type field effect transistor (FinFET) element, the residue of the polymer has become a serious problem. After the dummy poly gate is patterned on the fin structure, polymer residues may remain on the wafer and cause reliability problems. The polymer residues tend to accumulate at the unsmooth or angular surface at the corners between the sidewalls of the upwardly protruding fin and the top surface of the surrounding shallow trench isolation (STI) region. These polymer residues are difficult to remove and may result in undesired silicon voids in the source/drain doped regions during subsequent replacement metal gate (RMG) processes.

SUMMARY OF THE INVENTION

One object of the present invention is to provide an improved fin-type field-effect transistor (FinFET) device structure and a method for manufacturing the same in order to solve the deficiencies and shortcomings of the prior art.

According to an embodiment of the present invention, a semiconductor structure includes a substrate having a plurality of fin structures thereon. An isolation oxide structure is disposed in the substrate. The isolation oxide structure is disposed between two adjacent fin structures. The isolation oxide structure has a concave, curved top surface. A gate is disposed on the plurality of fin structures. A gate dielectric layer is disposed between the gate and the plurality of fin structures. A drain/source doped region is disposed in each of the plurality of fin structures.

According to another embodiment of the present invention, a semiconductor structure includes a substrate having a fin structure thereon. A first isolation oxide structure having a first curved top surface is disposed on one side of the fin structure. A second isolation oxide structure having a second curved top surface is disposed on the other side of the fin structure opposite to the first isolation oxide structure. The first isolation oxide structure and the second isolation oxide structure have different depths. A gate is disposed on the fin structure. A gate dielectric layer is disposed between the gate and the fin structure. A drain/source doped region is disposed in the fin structure.

The invention also discloses a method for manufacturing a semiconductor device. First, a substrate is provided with a fin structure thereon. A first isolation oxide structure is formed on one side of the fin structure to have a first curved top surface and a second isolation oxide structure having a second curved top surface is formed on the other side of the fin structure opposite to the first isolation oxide structure. The first isolation oxide structure and the second isolation oxide structure have different depths. A gate is then formed on the fin structure. A drain/source doped region is then formed in the fin structure.

By forming a concave, curved top surface in the isolation oxide structure or the shallow trench isolation region, unsmooth or angular surfaces at the lower corner of the sidewall of the adjacent fin or fin structure are eliminated and the polymer residue problem is solved. The silicon voids in the source/drain doped regions can be avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 to 8 illustrate a method for fabricating a semiconductor device according to an embodiment of the present invention, wherein FIGS. 1 to 5 are cross-sectional diagrams;

FIG. 4 shows an enlarged view of the fin structure;

FIG. 6 is a perspective view of the semiconductor device after forming a dummy gate on the fin structure and the isolation oxide structure;

FIG. 7 is a perspective view of the semiconductor device after forming a drain/source doped region in the fin structure on both sides of the dummy gate; and FIG. 8 illustrates a perspective side view of the semiconductor device after performing the replacement metal gate process.

DETAILED DESCRIPTION

In the following disclosure, details will be described with reference to the drawings. The contents of the drawings also form part of the detailed description of the specification, and are illustrated by way of specific examples in which the embodiment can be implemented. The following examples have described sufficient details to enable those of ordinary skill in the art to practice.

Of course, other embodiments may be adopted, or any structural, logical, and electrical changes may be made without departing from the embodiments described herein. Therefore, the following detailed description should not be taken as limiting, but rather, the embodiments contained herein will be defined by the appended claims.

Figure 1:
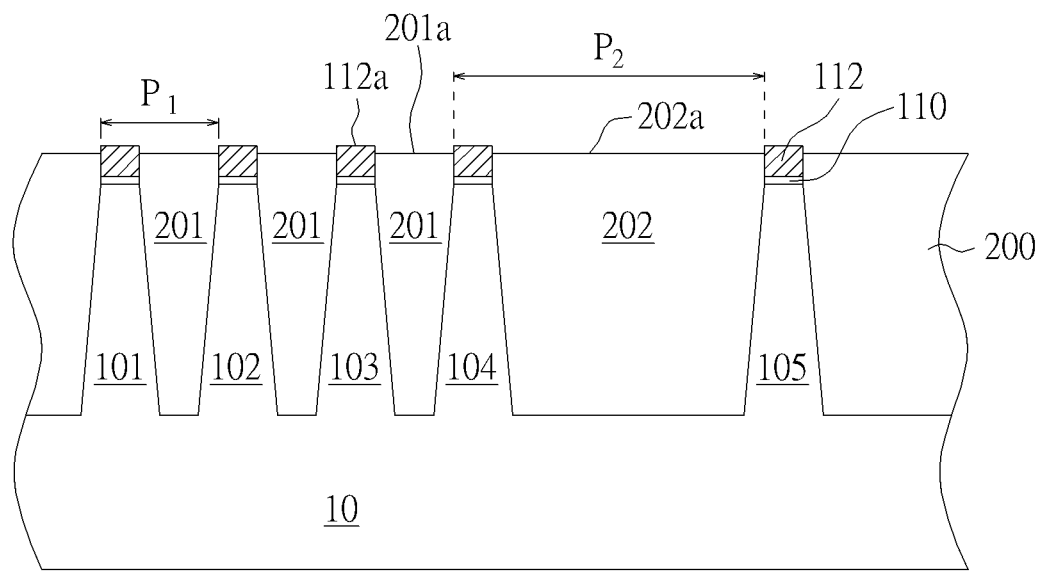

Please refer to FIG. 1 to FIG. 8, which illustrate a method for fabricating a semiconductor device according to an embodiment of the present invention. First, as shown in FIG. 1, a substrate 10 such as a germanium substrate, a germanium semiconductor substrate, or the like is provided. The substrate 10 has fin structures 101 to 105 thereon. For example, the consecutive four fin structures 101~104 may be densely arranged in parallel. The fin structure 105 may be an isolated (or semi-isolated) fin structure. For example, the pitch $P_1$ between the consecutive four fin structures 101~104 may range between 90 nanometers and 200 nanometers, and the pitch $P_2$ between the isolated fin structure 105 and the nearest fin structure 104 may range between 400 nanometers and 1000 nanometers, but not limited thereto. Such consecutive, closely-arranged and parallel four fin structures 101~104 and the isolated fin structure 105 may be a commonplace in a static random access memory (SRAM) circuit, but not limited thereto.

Since the fabrication method of the fin structures 101~105 is a well-known technique including lithography and etching processes, the details of which are not further explained herein for the sake of brevity. According to an embodiment of the present invention, a pad layer 110 and a hard mask layer 112 are provided on the fin structures 101~105. For example, the pad layer 110 may be a silicon dioxide layer, and the hard mask layer 112 may be a silicon nitride layer, but not limited thereto.

After completing the definition of the fin structures 101~105, an isolation oxide structure 200 is then formed between the fin structures 101~105. For example, on one side of the fin structure 104 (e.g., the left side of the fin structure 104 in the figure) and between the fin structures 101~104, a first isolation oxide structure 201 is formed. On the other side of the fin structure 104 opposite to the first isolation oxide structure 201 (for example, the right side of the fin structure 104 in the figure) and between the fin structures 104 and 105, a second isolation oxide structure 202 is formed. Since the isolation oxidation structure 200 can be formed by performing the conventional shallow trench isolation (STI) technology including the insulating layer deposition and the chemical mechanical polishing process, the details of which are not further explained herein for the sake of brevity. At this point, after polishing, the top surface 201ap of the first isolation oxide structure 201, the top surface 202ap of the second isolation oxide structure 202, and the top surface 112a of the hard mask layer 112 are approximately coplanar.

Figure 2:
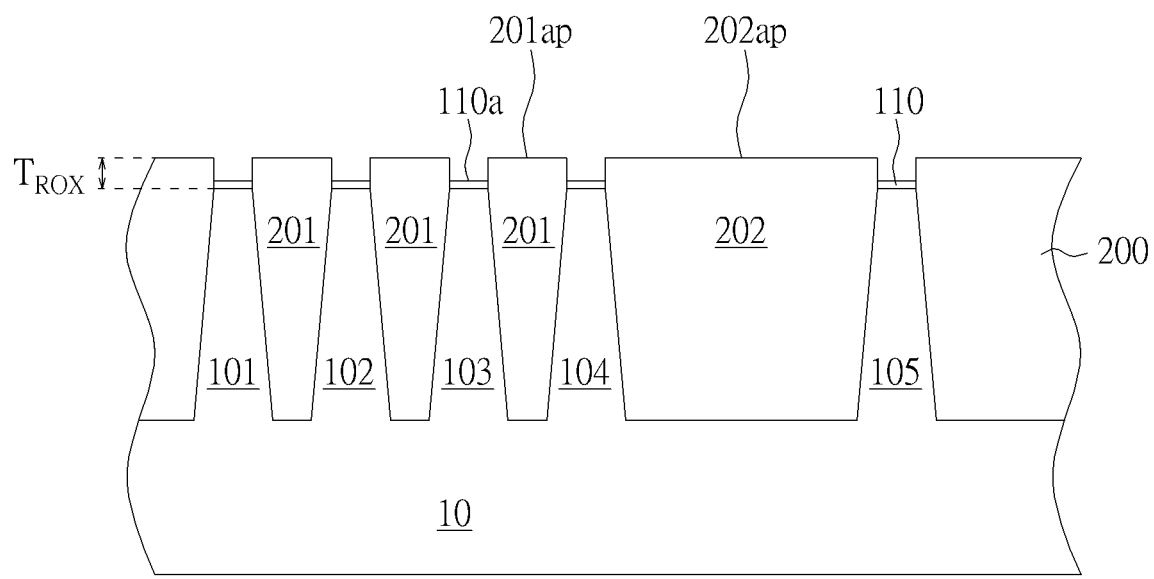

As shown in FIG. 2, the hard mask layer 112 is then selectively removed, thereby revealing the top surface 110a of the pad layer 110. For example, hard mask layer 112 may be removed using wet etching. At this point, a step height $T_{ROX}$ is formed between the first isolation oxide structure 201 and the top surface 110a of the pad layer 110. According to an embodiment of the present invention, $T_{ROX}$ needs to be less than 140 angstroms, for example, between 20 and 140 angstroms. According to an embodiment of the present invention, $T_{ROX}$ may be controlled by the chemical mechanical polishing and the original thickness of the hard mask layer 112.

Figure 3:
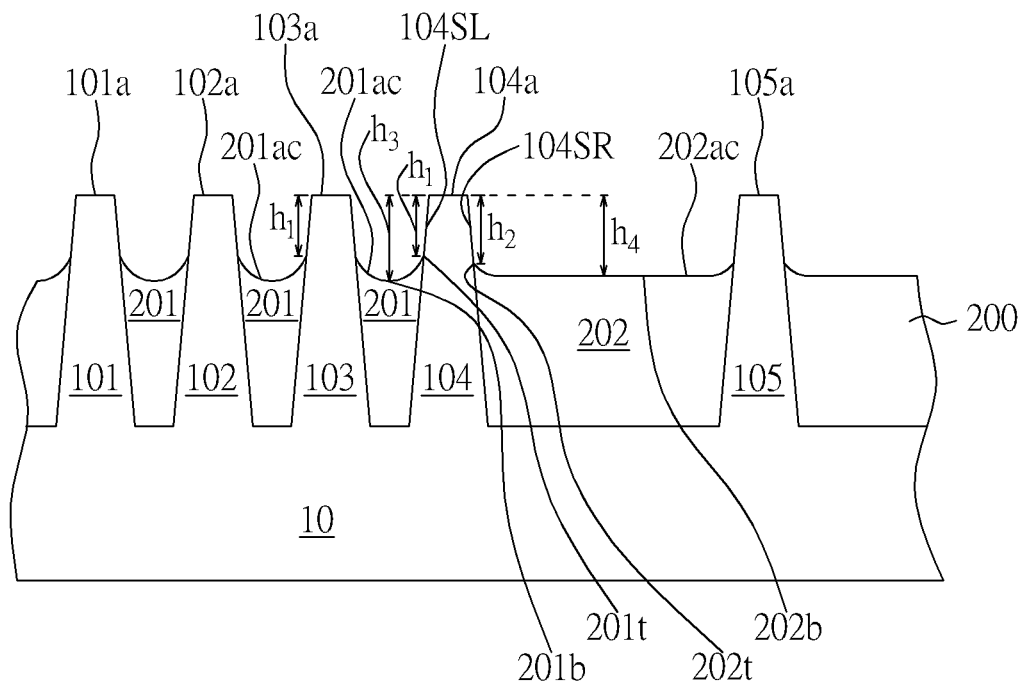

As shown in FIG. 3, an etching process, e.g., SiConi™ etching, is performed to selectively etch the exposed pad layer 110 and the isolation oxide structure 200. It is known that SiConi™ etching is a remote plasma assisted dry etching process that involves exposing a substrate or wafer to by-products of hydrogen, nitrogen trifluoride ($NF_3$), and ammonia ($NH_3$) plasma. For example, $NF_3$ and $NH_3$ are first excited to be converted into ammonium fluoride ($NH_4F$) and ammonium difluoride ($NH_4F.HF$). Then, $NH_4F$ and $NH_4F.HF$ react with silicon oxide and produce etching by-products such as solid ammonium hexafluorosilicate (($NH_4)_2SiF_6$), which will prevent further etching reactions. Next, annealing is performed to sublimate the solid etching by-products. For example, ammonium hexafluorosilicate is decomposed into gaseous silicon tetrafluoride ($SiF_4$), ammonia ($NH_3$), and hydrogen fluoride (HF) at high temperatures.

After the above etching process, the top surfaces 101a~105a and part of the sidewalls of the fin structures 101~105 are exposed. The top surfaces 101a~105a are approximately coplanar. The isolation oxide structure 200 is lower than the top surfaces 101a~105a and a curved top surface is formed. Hereinafter, the term "curved top surface" refers to a concave, curved top surface having a certain curvature as viewed in section, in other words, the formed curved top surface does not include a flat surface.

For example, the first curved top surface 201ac of the first isolation oxide structure 201 and the second curved top surface 202ac of the second isolation oxide structure 202 are lower than the top surfaces 101a~105a. The first curved top surface 201ac of the first isolation and oxidized structure 201 and the second curved top surface 202ac of the second isolation and oxidizing structure 202 are concave curved top surfaces in cross-section. More specifically, the first curved top surface 201ac of the first isolation oxide structure 201 and the second curved top surface 202ac of the second isolation oxide structure 202 are concave, arc-shaped top surfaces in cross-section. Herein, the term "concave" means recessing downwardly into the major surface of the substrate 10 in a direction that is perpendicular to the major surface of the substrate 10.

The first curved top surface 201ac of the first isolation oxide structure 201 has an uppermost edge 201t that is in contiguous with a first sidewall 104SL of the fin structure 104. The uppermost edge 201t has a depth $h_1$. Hereinafter, the term "depth" refers to the vertical distance measured from the top surfaces 101a~105a of the fin structures 101~105 unless otherwise specified. The second curved top surface 202ac of the second isolation oxide structure 202 has an uppermost edge 202t that is contiguous with a second sidewall 104SR of the fin structure 104. The uppermost edge 202t has a depth $h_2$, wherein the depth $h_2$ is greater than the depth $h_1$. According to an embodiment of the present invention, for example, the depth $h_1$ ranges between 400 and 500 angstroms, and the depth $h_2$ ranges between 450 and 550 angstroms.

According to an embodiment of the present invention, the concave first curved top surface 201ac has a lowest point 201b, approximately at the center of the concave first curved top surface 201ac between the adjacent fin structures 103 and 104. The lowest point 201b has a depth $h_3$ ranging between 500 and 700 angstroms. The concave second curved top surface 202ac has a lowest point 202b approximately at a midpoint of the concave second curved top surface 202ac between adjacent fin structures 104 and 105. The lowest point 202b has a depth $h_4$ ranging between 500 and 600 angstroms. According to an embodiment of the present invention, the depth $h_3$ is greater than the depth $h_4$.

Figure 4:
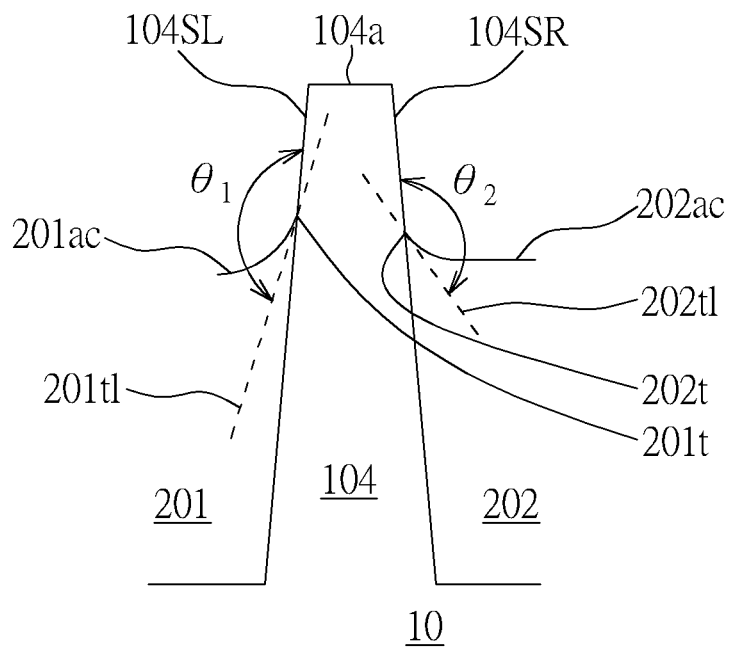

As shown in FIG. 4, the angle $\theta_1$ between the tangent 201t1 to the uppermost edge 201t that contacts the first sidewall 104SL and the first sidewall 104SL is approximately 130-140 degrees. The angle $\theta_2$ between the tangent 202t1 to the uppermost edge 202t that contacts the second sidewall 104SR and the second side wall 104SR is approximately between 125 and 135 degrees.

Figure 5:
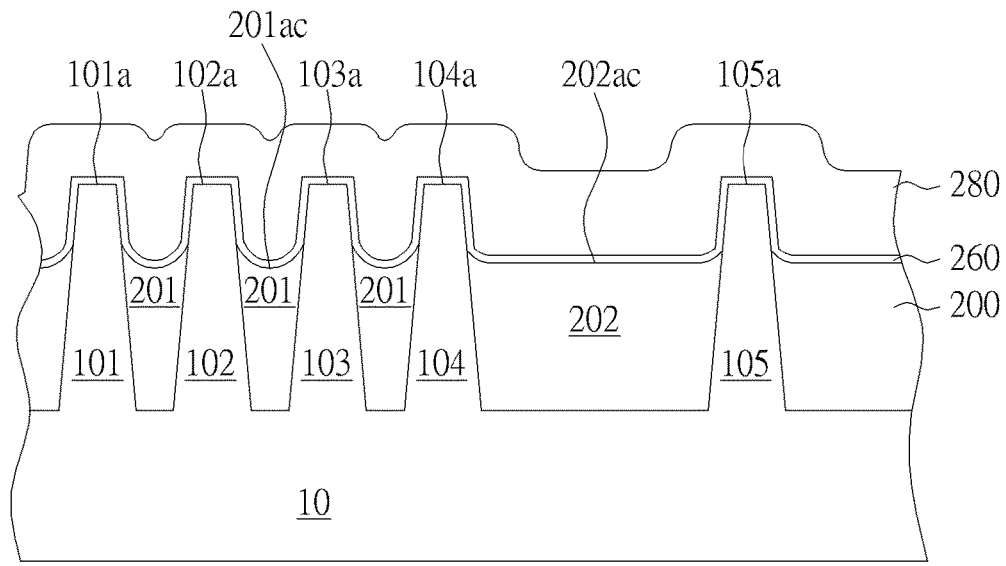
Figure 6:
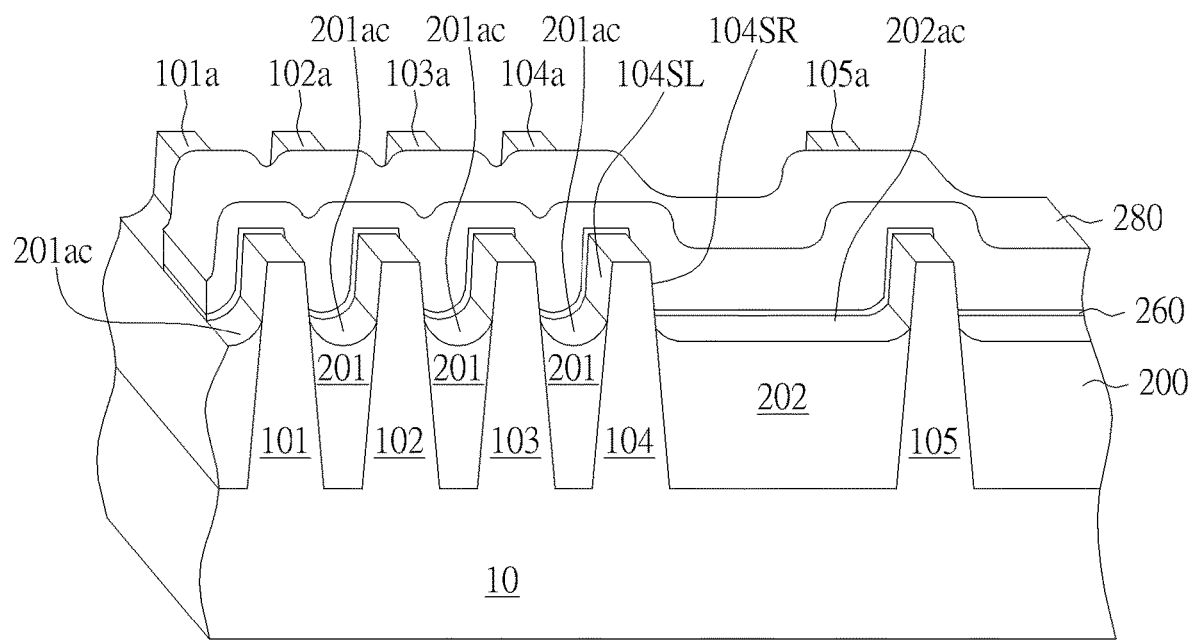

As shown in FIGS. 5 and 6, a dummy gate 280, e.g., a poly gate, is subsequently formed on the fin structures 101~105 and the isolation oxide structure 200. A gate oxide layer 260 may be formed between the dummy gate 280 and the fin structures 101~105 and between the dummy gate 280 and the isolation oxide structure 200. The dummy gate 280 may be composed of a single-layered polysilicon, or may be composed of a plurality of layers of materials, such as polysilicon and silicon nitride caps, but is not limited thereto.

Figure 7:
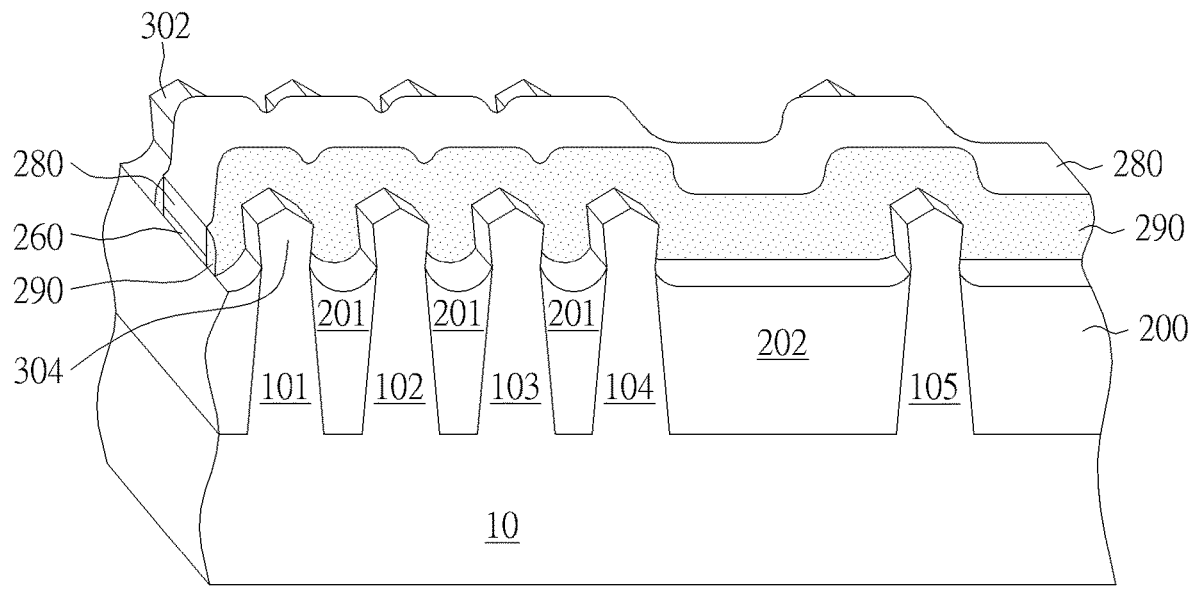

As shown in FIG. 7, spacers 290, for example, silicon nitride spacers, are then formed on both sides of the dummy gate 280. The source/drain doped regions 302 and 304 are formed in the fin structures 101~105 on both sides of the dummy gate 280. The source/drain doped regions 302 and 304 may comprise an epitaxially stressor layer, for example, a silicon phosphorus (SiP) epitaxial layer or a silicon germanium (SiGe) epitaxial layer, but not limited thereto. The formation of the above-mentioned source/drain doped regions 302 and 304 are well-known processes, so the details thereof are not further described. For example, trenches may be first etched in the fin structures 101~105 on both sides of the dummy gate 280, then an epitaxy step may be performed, and ion implantation may be performed to implant an N-type or P-type dopant into the source/drain doped regions 302 and 304.

Figure 8:
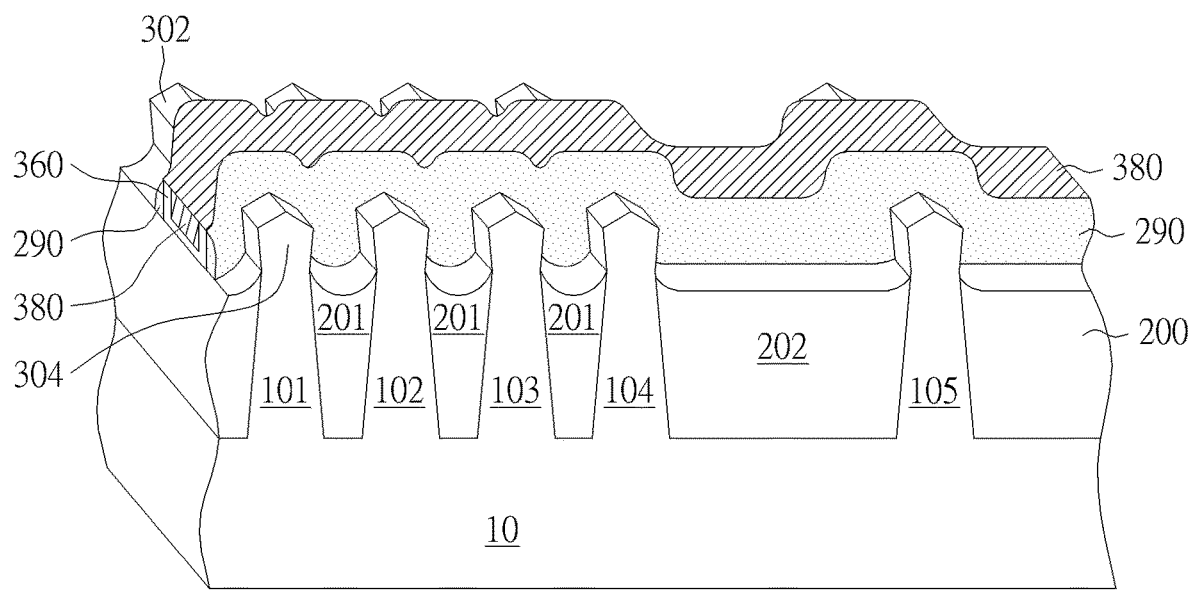

As shown in FIG. 8, after the source/drain doped regions 302 and 304 are completed, a replacement metal gate (RMG) process is performed to replace the dummy gate 280 and the gate oxide layer 260 with a metal gate 380 and a high-k gate dielectric layer 360, respectfully. The above-mentioned RMG process is a well-known process, so its details are not described further. For example, an interlayer dielectric layer (not shown) may be deposited first, then a chemical mechanical polishing (CMP) process may be performed to remove a portion of the interlayer dielectric layer and a portion of the dummy gate 280. The remaining dummy gate 280 and gate oxide layer 260 are etched and removed to form a gate trench, and then a high-k gate dielectric layer 360 and a metal gate 380 are filled in the gate trench. A chemical mechanical polishing can be performed again.

By forming a concave, curved top surface 201ac, 202ac in the isolation oxide structure 200, unsmooth or angular surfaces at the lower corner of the sidewall of the adjacent fins or fin structures 101~105 are eliminated and the polymer residue problem is solved. The silicon voids in the source/drain doped regions can be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor structure, comprising:
   a substrate having a plurality of densely arranged fin structures and an isolated fin structure thereon;
   an isolation oxide structure in the substrate between the plurality of densely arranged fin structures and the isolated fin structure, wherein the isolation oxide structure has a curved top surface, wherein the isolation oxide structure has an uppermost edge that is in contiguous with a sidewall of one of the plurality of densely arranged fin structures that is adjacent to the isolated fin structure, wherein an angle is defined between a tangent to the uppermost edge that contacts the sidewall, and wherein the angle is approximately 125-135 degrees, and wherein the uppermost edge of the isolation oxide structure is curved;
   a gate disposed on the plurality of fin structures;
   a gate dielectric layer disposed between the plurality of fin structures and the gate; and
   a source/drain doped region in each of the plurality of fin structures, wherein a first pitch between the densely arranged fin structures ranges between 90 nanometers and 200 nanometers and a second pitch between the isolated fin structure and the nearest densely arranged fin structure range between 400 nanometers and 1000 nanometers.

2. The semiconductor structure according to claim 1, wherein the plurality of fin structures comprises four consecutive line-shaped fin structures arranged in parallel with one another.

3. The semiconductor structure according to claim 1, wherein the curved top surface is a curved silicon oxide top surface.

4. The semiconductor structure according to claim 1, wherein the uppermost edge has a first depth measured from a top surface of said one of the plurality of densely arranged fin structures, and wherein said first depth ranges between 450 and 550 angstroms, and a second depth measured between two of the other densely arranged fin structures ranges between 500 and 700 angstroms, wherein the second depth is more than the first depth.

5. The semiconductor structure according to claim 1, wherein the gate is a metal gate.

6. The semiconductor structure according to claim 1, wherein the source/drain doped region comprises an epitaxial stressor layer.

7. The semiconductor structure according to claim 1, wherein the isolation oxide structure further comprises a second curved top surface adjacent to the isolated fin structure, and the second curved top surface has a flattened middle portion.

* * * * *